United States Patent [19]

Baker

[11] Patent Number: 5,323,528
[45] Date of Patent: Jun. 28, 1994

[54] SURFACE MOUNT PLACEMENT SYSTEM

[75] Inventor: Stuart Baker, Santa Ynez, Calif.

[73] Assignee: Amistar Corporation, San Marcos, Calif.

[21] Appl. No.: 76,240

[22] Filed: Jun. 14, 1993

[51] Int. Cl.⁵ .............................................. H05K 3/30
[52] U.S. Cl. .......................................... 29/721; 29/740
[58] Field of Search .................. 29/740, 741, 720, 721, 29/759

[56] References Cited

U.S. PATENT DOCUMENTS

| | | | |
|---|---|---|---|
| 4,135,630 | 1/1979 | Snyder et al. | 214/1 |
| 4,202,092 | 5/1980 | Shibasaki et al. | 29/741 |
| 4,290,732 | 9/1981 | Taki et al. | 414/72 |
| 4,381,601 | 5/1983 | Tamai et al. | 29/740 |
| 4,393,579 | 7/1983 | Van Hooreweder | 29/740 |
| 4,573,262 | 3/1986 | Dornes et al. | 29/739 |
| 4,624,050 | 11/1986 | Hawkswell | 29/26 |
| 4,858,308 | 8/1989 | Komori | 29/743 |
| 4,866,837 | 9/1989 | Heissenberger et al. | 29/741 |
| 5,208,969 | 5/1993 | Hidese | 29/740 |

*Primary Examiner*—Carl E. Hall

[57] ABSTRACT

A machine used to populate printed circuit boards (PCB) with surface mount electrical components, wherein an elongated PCB-carrying Y table intersects an elongated turret-carrying X oriented carriage structure intermediate a Y table component placement zone. Left and right vacuum quill-carrying turrets are independently movable along the carriage structure, the quills being movable in a Z direction, and the quills in each respective turret being adapted to pick-up selected components from respective left and right multiple feeder stations while the quills in the other turret simultaneously deposits components on a PCB supported on the Y table in the placement zone.

17 Claims, 4 Drawing Sheets

SURFACE MOUNT PLACEMENT SYSTEM

BACKGROUND

The present invention relates to an electrical component pick and placement machine, and more particularly to a surface mount device (SMD) placement system that is used to assemble printed circuit boards (PCB) with surface mount electrical components.

SMD have connection pads instead of elongated leads, and these components are mounted onto board-like panels that are formed on suitable dielectric material and have electrical circuits printed on or otherwise applied to their surface. The printed circuits include connection pads for registration with and electrical connection to corresponding connection pads of the SMD.

The mounting of discrete electrical components onto printed circuit boards by automated means is well known. For a rather extended period of time, the electrical components, such as resistors, capacitors, inductors, and the like, included axial, radial, or in-line leads which extended through holes in the PCBs. Over the years, several types of apparatus had been developed to automate this procedure and thereby increase production. Basically, these machines bend the leads, align the components and their leads with respect to lead holes in the printed circuit board to be populated, and then insert the leads into the appropriate holes. The leads are then bent over or clinched to retain the components on the board prior to a soldering operation which both mechanically and electrically bonds the component to the board. In more recent times, however, the SMD technique was developed which does not require through-hole insertion.

Surface mount devices lack or eliminate the long leads associated with through-hole mounted components. SMD's are finding wide use in the electronic industry, and like their leaded counterparts, require accurate placement on PCB's, or other substrate media, prior to soldering. Accordingly, automatic machines have been developed to accomplish this task.

According to the prior art, as exemplified by U.S. Pat. No. 4,381,601, electronic components such as semiconductor pellets or chips can be temporarily attached to the tip end of an attraction (vacuum) nozzle, held, and automatically oriented by means of a plurality of arms arranged along the outer periphery of the tip end of the sucking nozzle. The held electronic component was then transferred to a predetermined bonding position on a semiconductor device substrate before the arms were opened to bring down the electronic component onto the predetermined bonding position for bonding. Although this apparatus is adequate for the task of picking up and depositing a component, it does not include a reliable and accurate means for transporting the component from an input station to a desired location and in exact registration with connection pads on a PCB.

In U.S. Pat. No. 4,393,579, a device for mounting chip-type electronic components on a substrate is disclosed which is designed to enable accurate positioning and mounting of chip-type components such as SMD in a controlled and reproducible manner. This device includes a slide having a recess for accommodating and transporting a component. The component is linearly movable in a guide between a loading position and an unloading position, and a suction device which is movable in the vertical direction serves to pick up a component from the slide when the latter is in the unloading position, and then move the component downward through a passage in the guide to position the picked-up component onto the substrate located underneath the guide. Although this is an improvement over the previously known art, it still leaves much to be desired in speed of operation and reliability.

In U.S. Pat. Nos. 4,135,630 and 4,290,732, machines are described for picking up electrical components and placing them at desired positions and orientations on a substrate. The pick-up heads of these machines utilize a vacuum or suction tool by which components are held on the pick-up head, and pawls or fingers are used to position the components on the tools. These devices work well with electrical components of a particular size and shape, but such components are not all similar in dimension. At best these machines can handle a small range of sizes of components. However, it is frequently necessary to position a number of components of widely varying sizes and shapes on a single substrate, and the above-noted prior art devices cannot provide sufficient accuracy and reliability with a single pick-up head without manually adjusting or changing the pawls or fingers, which is very inconvenient and time-consuming. Subsequently, this problem has been solved by providing a plurality of pick-up heads, each adapted to pick up a different size range of components.

More recently, a head for handling various sizes of electrical components has been described in U.S. Pat. No. 4,624,050. This device includes a head for handling electrical components, the head including a plurality of orienting jaws mounted for movement toward and away from a component carried on a datum face of a tool on a tool holder when the holder is in one of the datum positions. A key feature of this device is that the jaws have a plurality of spaced sets of cooperating datum faces disposed generally transversely to the plane of the datum face of the tool in the holder. Each set of datum faces are disposed so as to be capable of orienting a component carried by a tool mounted on the tool holder when the holder is at a corresponding one of the datum positions. This allows for the handling of a wider variety of component sizes, but still cannot accurately accommodate an infinite variety of component sizes as may be required in the industry.

In order to eliminate the multiple jaw mechanism while attempting to maintain proper pad alignment, more recent developments have provided pick and placement machines again using only vacuum heads having no jaws. For example, in U.S. Pat. No. 4,858,308, an apparatus is disclosed for mounting small electronic parts such as chip capacitors and the like onto a printed circuit board through a series of work stations which are arranged in a closed-loop fashion at a periphery of a rotary-index table. This apparatus utilizes a plurality of suction devices for picking and placing operations. There is disclosed such an operation where suction pieces have various shapes and sizes to accommodate a wide variety of types and sizes of chips. It is taught that since a suction piece can be exchanged after mounting parts, then while one suction device performs a picking and placing operation of a chip, another suction device exchanges the suction piece to accommodate another chip configuration.

Also in this regard, attention is directed to U.S. Pat. No. 4,866,837 which concerns a dual port alignment assembly station for attaching components to circuit boards. An electrical component, such as a chip, is held by an appropriate robotic mechanism over a printed circuit board, and a dual port placement probe is inserted between the component and the circuit board. The probe is provided with a pair of oppositely directed viewing arrangements which respectively look toward the component and the circuit board. The optical images from the pads on both the component and the circuit board are then detected by respective cameras for the two, and the signals derived from the images obtained by the cameras are processed manually or by a conventional vision system. The system produces signals to drive a robot holding the component.

It should thus be clear that in the prior art in the subject area of interest most schemes require either a movable jaw mechanism or a complicated vacuum arrangement. These schemes generally lack the versatility reliability and accuracy required to handle a large variety of component sizes of SMD's that is needed in the industry. It should therefore also be clear that an accurate and reliable SMD pick and placement machine that does not utilize a jaw mechanism or a complicated viewing or vacuum system will obviate the aforementioned shortcomings and would constitute a significant advancement in the art.

SUMMARY OF THE INVENTION

In view of the foregoing factors and conditions characteristic of the prior art, it is a primary object of the present invention to provide a new and improved surface mount placement system.

Another object of the present invention is to provide a simple yet reliable and very accurate placement mechanism as part of a surface mount component transporting and mounting system.

Still another object of the present invention is to provide a SMD transporting and mounting mechanism which eliminates the problems associated with prior art mechanisms.

Yet another object of the present invention is to provide an electrical component pick and placement machine that utilizes a pair of rotatable, vacuum quill-carrying turrets adapted to precisely place SMD at desired positions on a PCB.

A further object of the present invention is to provide an advanced surface mount placement system utilizing two independent turret assemblies that travel on a common rail system.

Still a further object of the present invention is to provide an improved surface mount placement system having two independent pick-up/placement turrets with six component pick-up quills on a precision rotary assembly, where one turret is picking up components while the other is placing components.

Yet a further object of the present invention is to provide a surface mount placement system that uses a vision system to locate panel fiducials, and to recognize and orient components on vacuum pick-up quills for precise placement.

In accordance with an embodiment of the present invention, a surface mount placement system includes a PCB-carrying table movable along a Y axis, the table having a PCB loading/exchange position adjacent one end of its travel, and a component mounting zone of positions adjacent its other end of travel. The invention also includes an elongated turret carriage rail structure extending parallel to an X axis intersecting the Y axis intermediate the zone of positions of the table. Left and right component multiple-feeder stations are also disposed on opposite sides of the Y axis and centered about the X axis, each of the stations carrying a plurality of adjacent component-dispensing mechanisms. Left and right turrets that are independently movable along the X axis are supported by the rail structure, each of the turrets being rotatable about its associated vertical central axis. Also, the invention includes a plurality of component pick-up quills mounted in each of the turrets, each of the quills being selectively movable only along a Z axis, constrained from rotational movement with respect to the turrets, and adapted to pick-up selected electronic components from a selected associated one of the component-dispensing mechanisms and to place selected ones of the components at desired locations on a PCB carried by the table while in the component mounting zone. The quills in one of the turrets are capable of picking up components while the quills in the other of the turrets are placing components.

The rail structure may be a common X rail structure supporting both of the turret heads, which heads may support six quills. Also, the Y table may be movably supported on an elongated Y rail structure. In accordance with an embodiment of the invention, the left turret is movable between the left-most component-dispensing mechanism and at least to the right most edge of a PCB carried by the Y table. Also, the right turret is movable between the right-most component-dispensing mechanism and at least to the left-most edge of a PCB carried by the Y table.

The features of the present invention which are believed to be novel are set forth with particularity in the appended claims. The present invention, both as to its organization and manner of operation and use, together with further objects and advantages thereof, may best be understood by making reference to the following description taken in conjunction with the accompanying drawings in which like reference characters refer to like elements in the several views.

The inventor's new technique provides a surface mount placing machine that handles a wide range of components, from 0402 chips to 40 mm square QFP, and handles fine pitch components (to 0.4 mm lead spacing). It utilizes no centering jaws to align components, and has provision for a large inventory of components on line (160 8 mm reels).

The invention is very fast in that the maximum cycle rate is approximately 7,000 components per hour, and can transfer PCBs through the machine at high speed.

BRIEF DESCRIPTION OF THE DRAWINGS

The various features and advantages of the present invention may be more readily understood with reference to the following detailed description taken in conjunction with the accompanying drawings, wherein like reference characters relate to like elements and in which.

DETAILED DESCRIPTION

Figure 1:
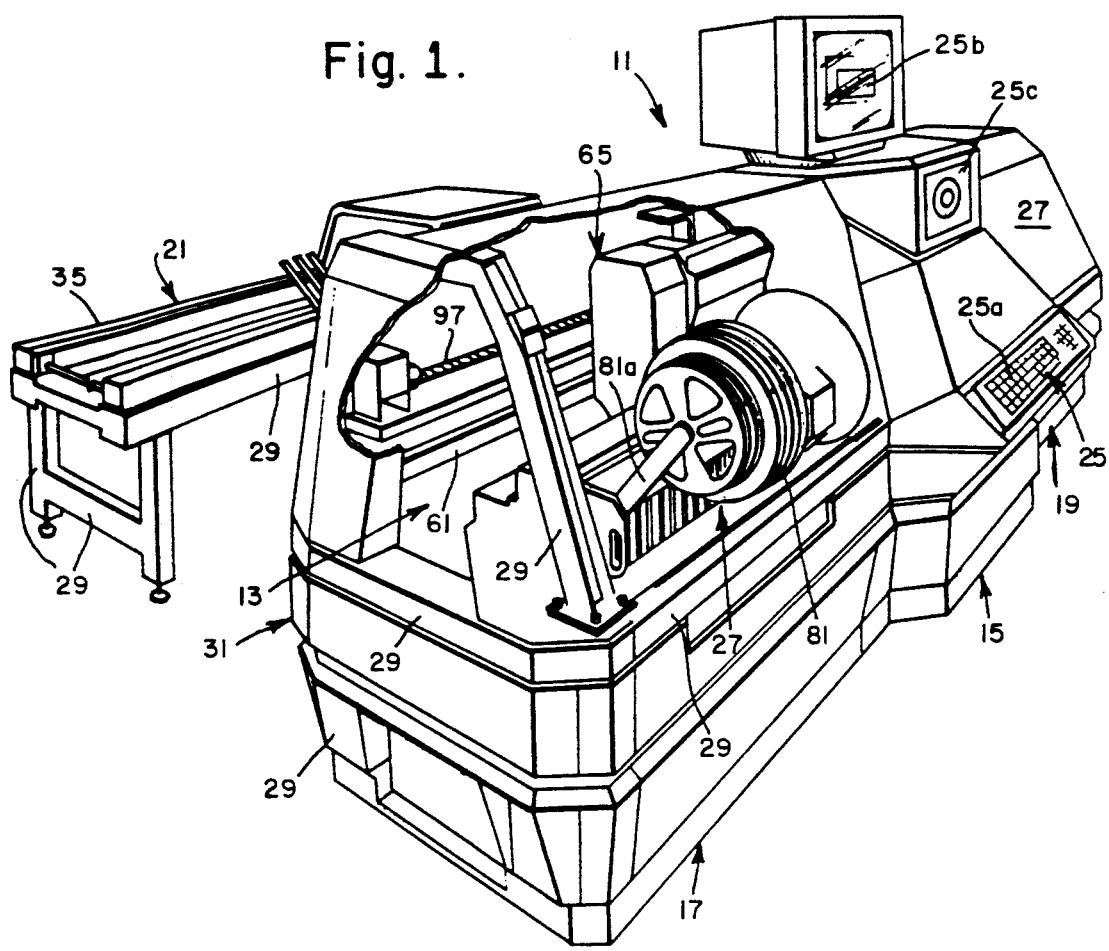
FIG. 1 is a perspective view of a component pick and place machine incorporating the surface mount placement system of the present invention.
Figure 2:
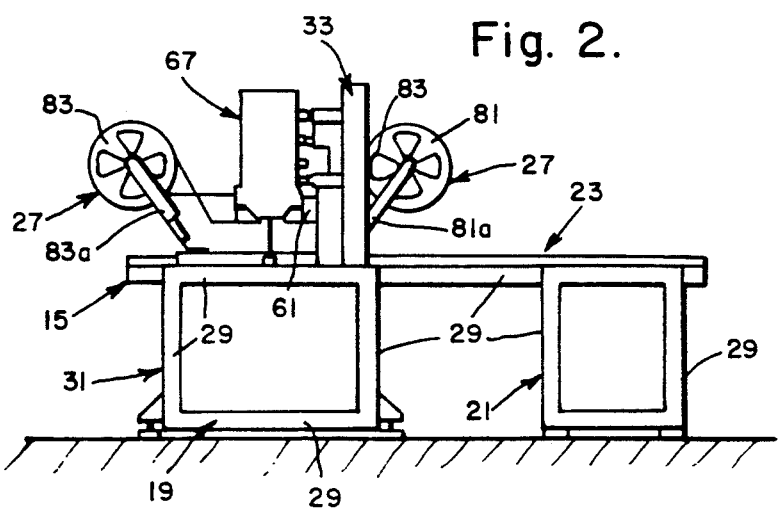
FIG. 2 is a right side elevational diagrammatical representation of the component pick and place machine with its placement system of FIG. 1.
Figure 3:
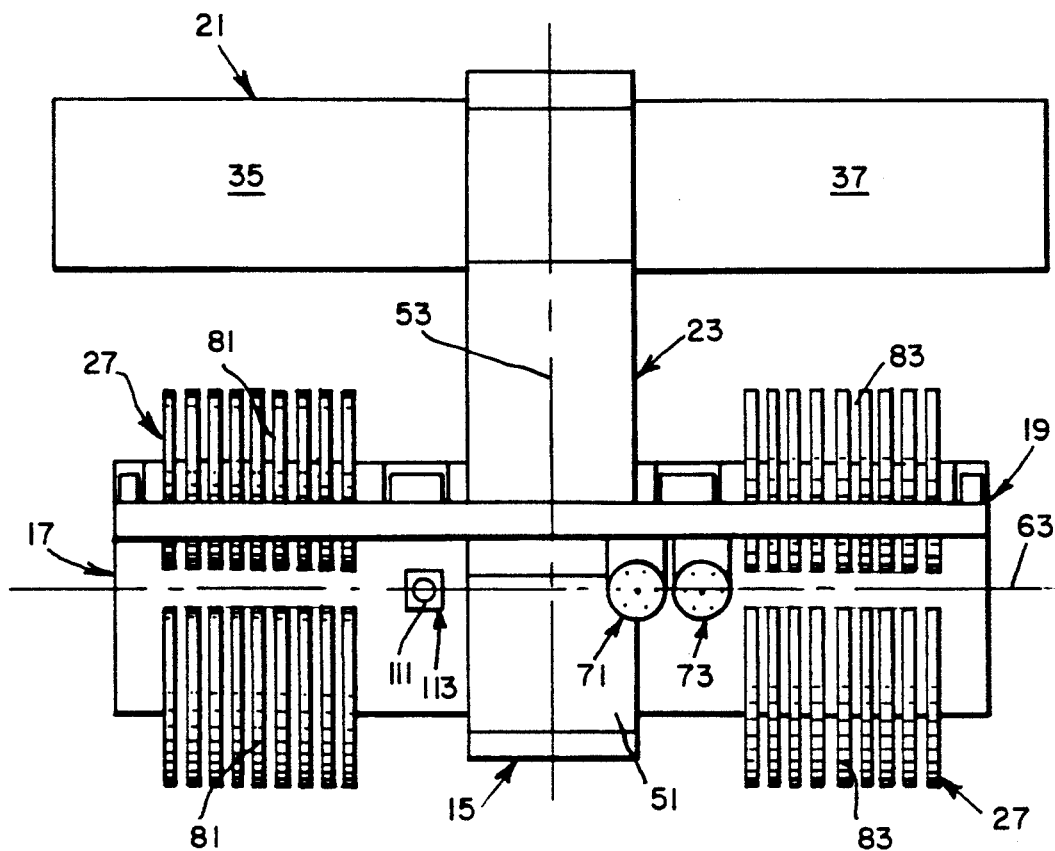
FIG. 3 is a diagrammatical representation top plan view of the system shown in FIG. 1.

Referring now to the drawings and more particularly to FIGS. 1 through 4, there is shown an electrical component pick and placement machine 11 including a surface mount placement system generally identified by reference numeral 13.

The machine 11 includes main central section 15, a main left side section 17, a main right side section 19, a generally parallel rear board conveyor section 21, and a central orthogonal connecting section 23. The main central section 15 also includes a manual/program control console portion 25 with a conventional keyboard 25a with a curser-controlling trackball, and video displays 25b and 25c. Conventional component input supply reals, tubes, and tray feeder stations 27 are suitably selectively mounted at the front and rear of both the left and right side sections 17, 19.

As can be seen in FIGS. 1-4, the main and side sections are constructed in an extremely strong and rigid manner with frame and brace members 29 in order to assure reliable and repeatable operation. A strong lower frame structure 31 supports an equally strong and rigid upper gantry structure 33. Preferably, the gantry structure 33 and the lower frame structure 31 are constructed using welded tubular steel. This same construction technique is utilized throughout the entire machine 11 including the board conveyor section 21 and the connecting section 23. Again, this sturdy construction assures that the surface mount placement system 13 will exhibit solid operational reliability without the need for constant re-adjustment or recalibration.

It can also be seen from these figures that operator protection has been a prime concern to the designer of the machine 11 by having all the feeders on the same side of the rear board conveyor structure 21 so that an operator need not cross over or through the conveyor line to get to the feeders on the other side of the machine.

The rear board conveyor structure 21 consists of an input conveyor section 35 and an output conveyor section 37, each configurable for left-to-right or right-to-left operation.

Figure 5:
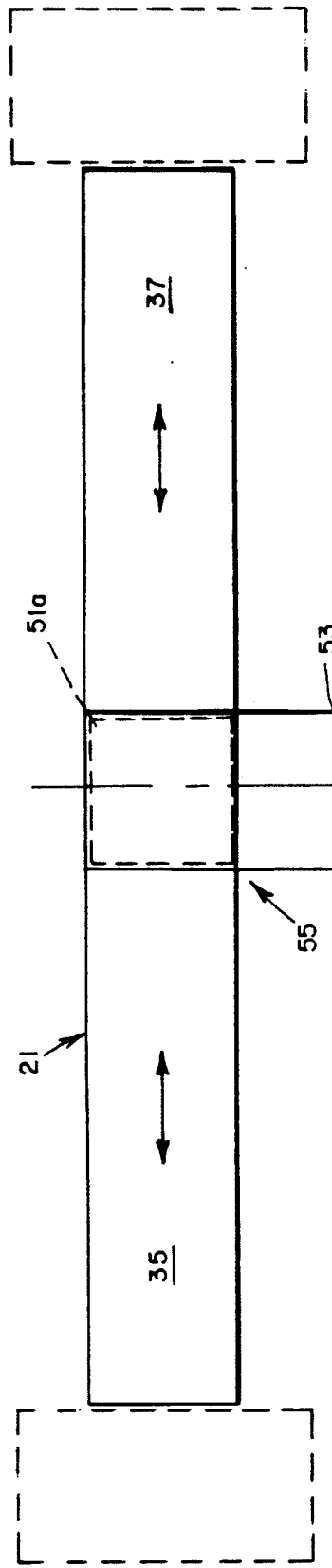
FIG. 5 is a schematic representation of basic elements of the surface mount placement system in accordance with the invention.
Figure 5:
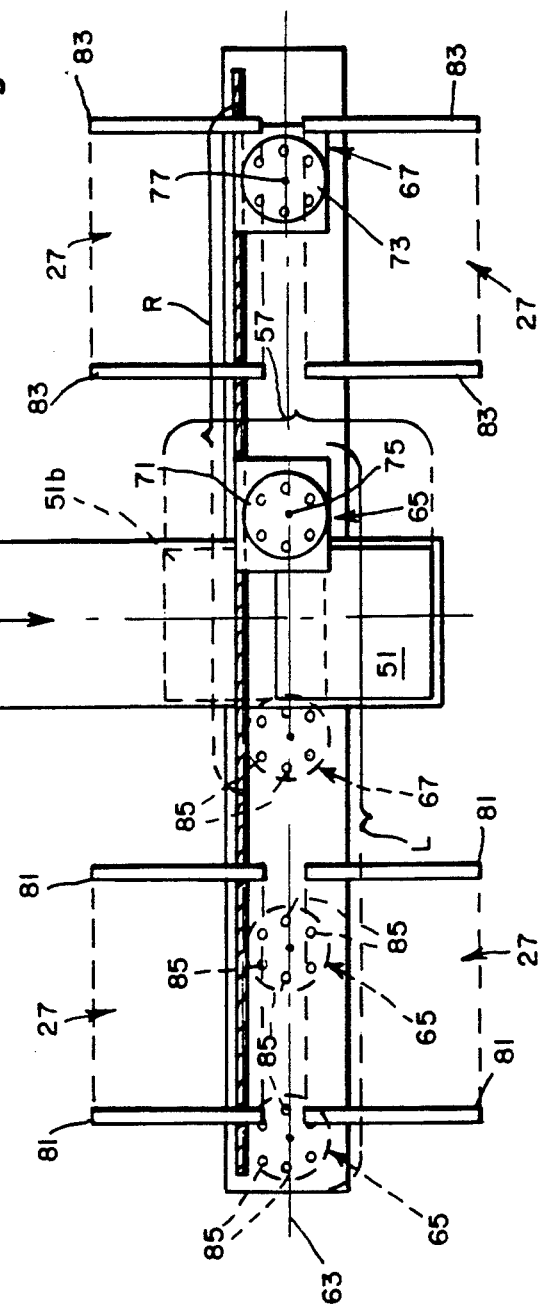

In order to more clearly describe the invention as embodied in the surface mount placement system 13, reference is now also made to FIG. 5. Here, a PCB-carrying Y table 51 is shown movable along a Y axis, indicated by reference numeral 53. The table 51 is shown by dashed outline 51a in its PCB loading/unloading position 55 adjacent its most rearward extent of travel. Solid outline 51 and dashed outline 51b show the table 51 in its leading edge loading position and trailing edge loading position, respectively, the most rearward edge of the table 51 and the most forward edge of the table 51b defining the table's component mounting zone 57.

The Y table 51 may also be a welded tubular structure, and is suitably coupled to a Y table lead screw 59 driven by a conventional Y servo motor 59a.

An elongated turret carriage rail structure 61 (shown in FIGS. 1, 2, and 6) extends parallel to an X axis (line 63 in FIGS. 3 and 5) and intersects the Y axis 53 intermediate the zone of component mounting positions 57. A left turret head 65 and a right turret head 67 are independently mounted on the rail structure 61 and are movable along the X axis, each turret head carrying an associated turret 71, 73 that are rotatable about their associated Z-oriented central axes 75 and 77, respectively.

The invention also includes a left and right multiple-feeders 81 and 83 supported by associated arm members 81a, 83a (in feeder stations 27) that are disposed on opposite sides of the Y axis 53 and centered about the X axis 63. Further, each turret head includes a plurality of conventional component vacuum pick-up quills 85. Each of these quills is provided with a conventional vacuum nozzle 87 (FIG. 6) which are tailored to the component to be picked. For example, eight nozzle types may be used for 0402 chips, to melfs, to the largest QFP components. Each of the quills 85 is selectively movable along a Z axis (parallel to axes 75 and 77) and are adapted to: (1) pick-up selected electronic components from a selected associated one of the component dispensing feeders 81, 83, and (2) place selected ones of the components at desired locations on a PCB carried by the table 51 while the table is in the component mounting zone 57.

Each of the six quills 85 on a turret is independently operable, and each has its own vacuum venturi for component pickup. Also, each quill 85 may have a conventional analog vacuum gauge (not shown) for determining if the component is held properly by a nozzle tip 89. Further, each quill may float on a conventional air bearing and be restrained from rotary motion by a conventional spring loaded arm against a smooth pin arrangement. Each quill 85 may be actuated in the Z direction, up and down, independently of, or in any combination with, the other quills 85. And each quill may be attached to a conventional air cylinder connected to a vacuum when the quill is to remain in the up position, or connected to a conventional regulated source of air pressure when the quill is to move downward.

Figure 4:
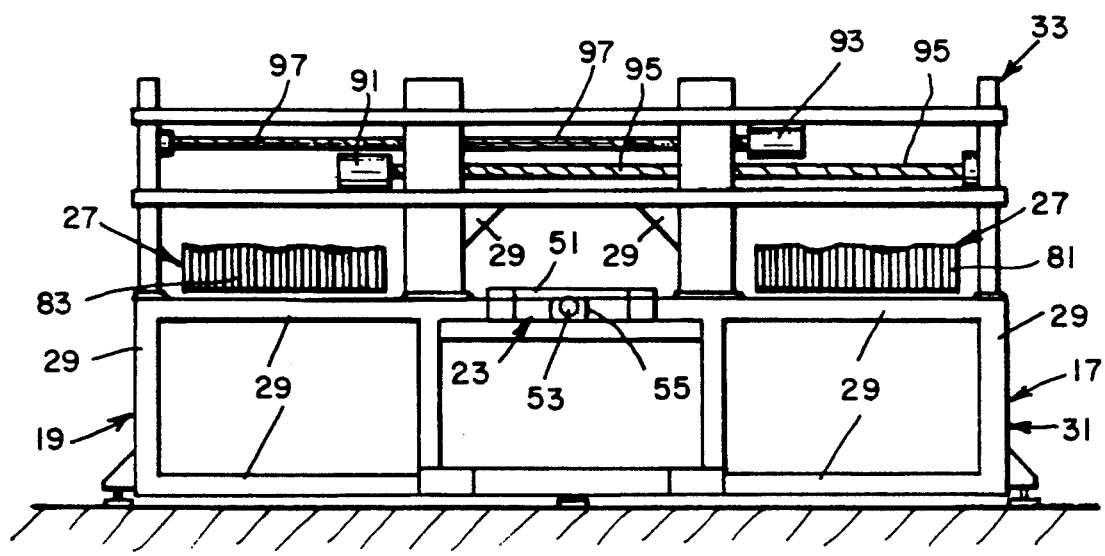
FIG. 4 is a rear diagrammatical view of the system of FIG. 1.

The turret carriage rail structure 61 may consist of a single set of precision rails that extend just beyond the left and right component feeder stations 27. Each turret head 65, 67 is shown in FIG. 4 to be driven in the X direction by an associated servo motor 91, 93 that is direct coupled to an associated large diameter class 3 lead screw 95, 97, respectively. These lead screws are disposed in parallel relationship one above the other and, the rail structure 61, the servo motors 91, 93 and bearing structures 99 supporting the lead screws 95, 97 are mounted on the rigid gantry structure 33 supported by the frame structure 31.

Figure 6:
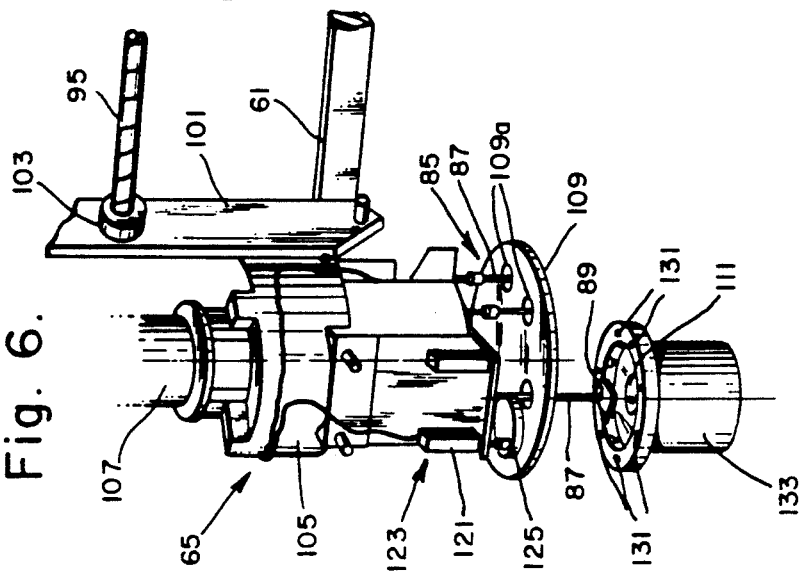
FIG. 6 is an enlarged perspective diagrammatical view of a portion of one of the two independently movable turret heads of the surface mount placement system.

As partially seen in FIG. 6, the left turret head 65 (similar to the right turret head 67) includes a main support structure 101 with conventional bearings (not shown) riding on the rail structure 61, and also having conventional threaded collars 103 threadably engaged with its associated large diameter lead screw 95 for movement of the head 65 in either X direction. The head 67 also includes a main body casting 105 that centrally supports a turret rotating servo motor 107. This motor not only rotates a quill-supporting structure (not shown) but also a lower circular Z plate 109 that includes apertures 109a therethrough registering with each of the quill nozzles 87. The Z plate 109 is moved downward under servo control when any quill 85 is moved in that direction. At the bottom of the quill stroke, the Z plate overtravels slightly allowing a programmed air pressure to apply the appropriate temporary force to the top of the placed component.

In this configuration, each turret head has full access to the entire width of any PCB supported by the table 51 in the zone 57, and the left turret 71 has access to all of the feeders 81 on the left side of the machine while the right turret 73 has access to all right side feeders 83. And, while the vacuum quills 85 of the right turret 73 are placing components on a board to be populated, the left turret quills 85 simultaneously pick up components from the left side feeders, and visa versa.

Also, in accordance with an embodiment of the invention, the spacing between pickup points of the component dispensing feeders 81, 83 exactly coincides with the spacing between the vacuum nozzles of the quills 85 so that as many as four components may be picked simultaneously.

In operation, as the right head 67 is placing components on a PCB in the zone 57, the left head 65 first picks up desired components from its feeders before moving to a conventional upward looking video camera 111 (FIG. 3) of a upward looking vision system 113 for position measurement of each component on the left head's respective nozzles 87. Thus, in contrast to the prior art, no centering jaws are used for component positioning on the vacuum nozzles. All centering is done by the vision system 113 using conventional 256 level gray scale resolution. The vision system 113 herein utilized is of conventional design well known to those working in the field and, accordingly, no detailed description of such the vision system is provided. Of course, the vision system 113 also includes a right side upward looking video camera just to the right of the Y table 51 in its zone 57 in order to handle the right turret 73.

With the exact position and rotation of the components known from the upward-looking vision system 113 output, the left head turret 71 and the Y table 51 are corrected by conventional computational means for positional or rotational errors of the component's location, before the servo motor 91 is again actuated to move the turret 71 over the table 51 and the component placed on the board. In the meantime, the right head turret 73 is picking the next set of components from the right side multiple feeders 83.

Further, each turret head 65, 67 contains a conventional downward looking video camera 121 (FIG. 6) connected to a conventional vision pattern recognition system 123. Both head cameras 121 (in left head 65 and in right head 67) are mounted on their respective body castings and have a field of view of either a PCB or their respective component pick-up location through an associated aperture 125 in its turret's lower plate 109. The vision pattern recognition system 123 is independently used to locate conventional board fiducials prior to part placement to calculate component location offsets in X, Y, and rotation angle. Additionally, local fiducials for large components, especially fine pitch components, are located with the head turret's downward looking camera 121 for more precise matching of copper pads and component leads. Fiducials may be of any design. By using techniques well known in the art, either a learned or a more accurate synthetic fiducial master is compared to the observed fiducial on the board for determining accurate location offsets. The video display 25c in the control console 25 allows an operator to observe any camera's field of view, and may be used for diagnostic purposes during pattern recognition activities. Again, for the sake of simplicity, the details of the visual systems will not be described in detail as they are well known to those practicing in the art.

In accordance with still another embodiment of the invention, the upward looking video camera 111 may be surrounded with a ring of LEDs 131 mounted on a pedestal 133 to provide illumination from below a component to be placed. This illumination is focused on a white disk (not shown) attached to each vacuum nozzle, and not on the bottom of the component held by the nozzle. In this manner, a backlit silhouette of a component is obtained, providing maximum outline definition. To eliminate mechanical inaccuracies due to Z stroke travel of a vacuum quill, the component's location in X, Y, and rotational angle is determined by the aforementioned pattern recognition vision system with the vacuum nozzle extended; that is, with the component's bottom surface at board level.

Figure 7:
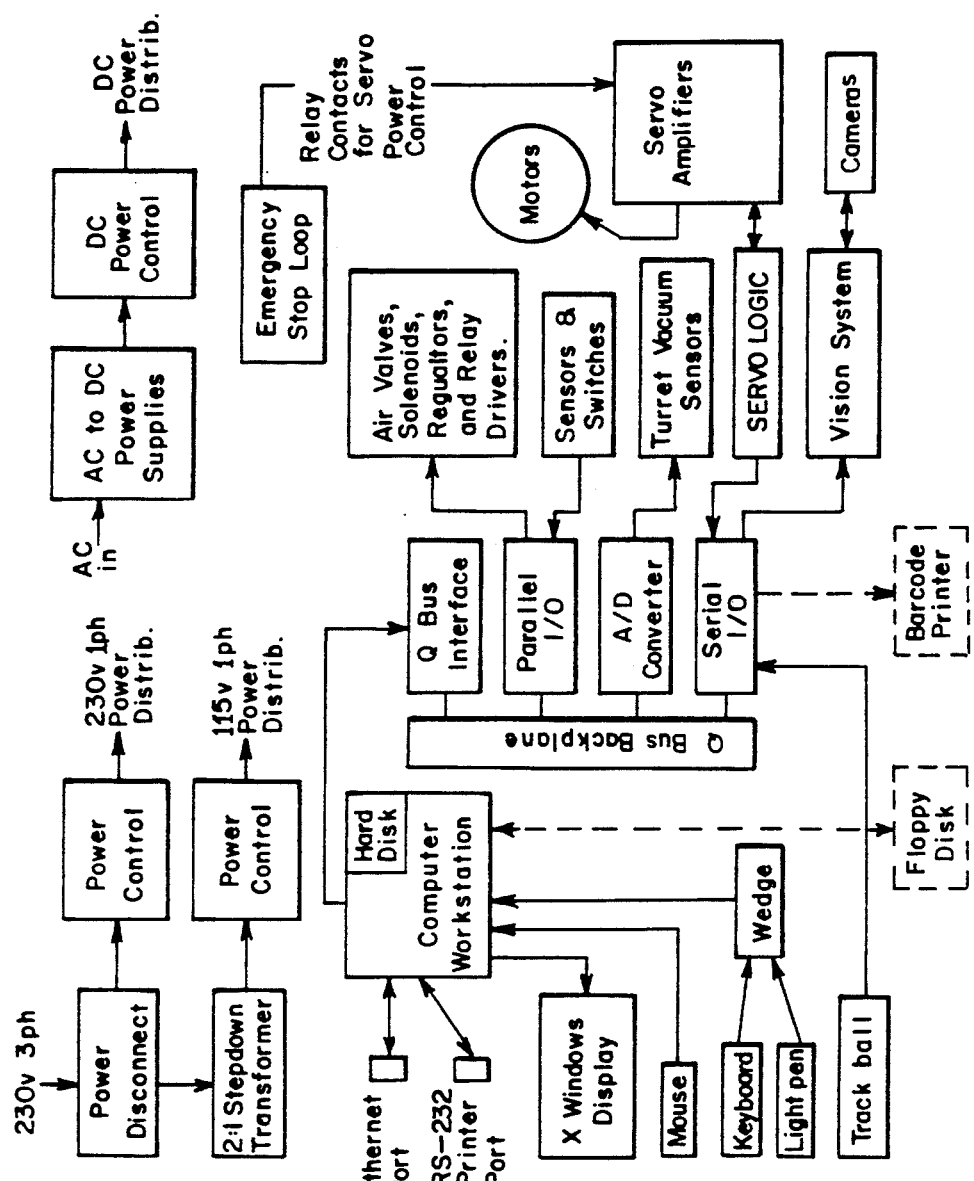
FIG. 7 is a simplified block diagram of the various functional portions of an electrical component pick and placement machine incorporating the surface mount placement system according to the invention.

Referring now to the simplified block diagram of FIG. 7, there is shown the functional interrelationships that are provided in an electrical component pick and placement machine 11 incorporating the surface mount placement system 13 of the invention. This diagram clearly describes to one skilled in the art functional aspects of components that may be incorporated in machine 11 incorporating an embodiment of the present invention. This figure is provided to allow those skilled in the art to more easily visualize the overall functioning of the machine 11 and not particularly to describe the invention.

In surface mount placement systems constructed in accordance with the present invention, head positioning in the X direction has been found to be repeatable to five ten-thousandth of an inch, as is the board positioning in the Y direction. Also, the rotational repeatability of the turret head has been found to be two one-hundredths of a degree, making this system one of the most accurate systems in the industry.

From the foregoing, it should be obvious that there has herein been described a new and improved surface mount placement system that is easily constructed, economical to build, easy to operate, and very quick, accurate and effective in operation. Although several embodiments of the invention have been described in detail, again, it should be understood that additional embodiments and arrangements can be readily devised by those skilled in the art without departing from the scope of the invention.

What is claimed is:
1. A surface mount placement system, comprising:
 a PCB-carrying Y table movable along a Y axis, and having a PCB loading/unloading position adjacent one end of its travel, and a component mounting zone of positions adjacent its other end of travel;
 elongated turret carriage rail structure extending parallel to an X axis intersecting said Y axis intermediate said zone of positions;
 left and right component multiple-feeder stations, said stations being disposed on opposite sides of said Y axis and centered about said X axis, each station carrying a plurality of adjacent component-dispensing mechanisms left and right turrets independently movable along said X axis supported by said rail structure, each said turret being rotatable about its associated vertical central axis; and pick-up/placement means including a plurality of component pick up quills mounted in each of said turrets, each of said quills being selectively movable only along a Z axis and constrained from rotational motion relative to said turrets, for picking up selected electronic components from a selected associated one of said component-dispensing mechanisms and for placing selected ones of said components at desired locations on a PCB carried by said table while in said component mounting zone, said quills in one of said turrets adapted to pick up components while said quills in the other of said turrets are placing components.

2. The surface mount placement system of claim 1, wherein said rail structure is a common X rail structure associated with both of said turrets.

3. The surface mount placement system of claim 1, wherein each of said turrets support six of said quills.

4. The surface mount placement system of claim 1, wherein said Y table is movably supported on an elongated Y rail structure.

5. The surface mount placement system of claim 1, wherein said left turret is movable between the left-most component-dispensing mechanism and at least to the right-most edge of a PCB carried by said Y table, and wherein said right turret is movable between the right-most component-dispensing mechanism and at least to the left-most edge of a PCB carried by said Y table.

6. The surface mount placement system of claim 1, also comprising Y table movement means coupled to said Y table for controllably moving said Y table between said ends of travel.

7. The surface mount placement system of claim 1, also comprising turret movement means having independent left and right turret movement mechanisms coupled to an associated one of said turrets for independently controllably moving said turrets.

8. The surface mount placement system of claim 1, also comprising PCB conveyor means associated with said loading/unloading position for supplying to and carrying away PCB from said Y table.

9. The surface mount placement system of claim 8, wherein said conveyor means includes a left conveyor mechanism extending from the left edge of said Y table when said Y table is in its loading/unloading position, and includes a separate right conveyor mechanism extending from the right edge of said Y table when said Y table is in its loading/unloading position.

10. The surface mount placement system of claim 9, wherein said left and right conveyor mechanisms cooperatively move PCB in either the left or right directions.

11. The surface mount placement system of claim 6, wherein said Y table movement means includes an elongated Y lead screw extending in the Y direction, and a Y servo motor coupled to and rotating said Y lead screw, said Y lead screw being coupled to said Y table.

12. The surface mount placement system of claim 7, wherein said turret movement means includes a separate elongated X lead screw extending in the X direction and each such X lead screw being coupled to an associated one of said turrets, and associated X servo motors coupled to and independently rotating a different one of said X lead screws.

13. The surface mount placement system of claim 1, wherein said turrets are rotatable more than 360 degrees.

14. The surface mount placement system of claim 1, wherein said turrets are restrained from rotation while associated quills are in their pick-up and placement positions.

15. The surface mount placement system of claim 1, also comprising vision means including an upward looking video camera for determining the proper rotation angle of said turrets for placement, calculating the proper X position of said turrets, and proper Y position of said Y table.

16. The surface mount placement system of claim 15, wherein said vision means also includes illumination means including a ring of LEDs surrounding said upward looking video camera for illuminating the bottom of a component to be placed.

17. The surface mount placement system of claim 1, also comprising vision pattern recognition means and a downward looking video camera mounted on said turrets operatively coupled to said recognition means for locating PCB fiducials and calculating component location offsets in X, Y, and rotation angle.

* * * * *